(12) United States Patent
Chou et al.

(10) Patent No.: US 11,664,383 B2
(45) Date of Patent: *May 30, 2023

(54) SEMICONDUCTOR STRUCTURE (71) Applicant: TAIWAN SEMICONDUCTOR MANUFACTURING COMPANY LTD., Hsinchu (TW)

(72) Inventors: Hsueh-Chih Chou, Tainan (TW); Chia Hao Tu, Tainan (TW); Sang Hoo Dhong, Hsin-Chu (TW); Lee-Chung Lu, Taipei (TW); Li-Chun Tien, Tainan (TW); Ting-Wei Chiang, New Taipei (TW); Hui-Zhong Zhuang, Kaohsiung (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 58 days.

This patent is subject to a terminal disclaimer.

(21) Appl. No.: 17/330,246

(22) Filed: May 25, 2021

(65) Prior Publication Data
US 2021/0280608 A1     Sep. 9, 2021

Related U.S. Application Data (63) Continuation of application No. 16/884,898, filed on May 27, 2020, now Pat. No. 11,037,957, which is a continuation of application No. 16/007,973, filed on Jun. 13, 2018, now Pat. No. 10,685,982.

(60) Provisional application No. 62/592,178, filed on Nov. 29, 2017.

(51) Int. Cl.
*H01L 27/118* (2006.01)
*H01L 27/02* (2006.01)

(52) U.S. Cl.
CPC .... *H01L 27/11807* (2013.01); *H01L 27/0207* (2013.01); *H01L 2027/11812* (2013.01); *H01L 2027/11814* (2013.01); *H01L 2027/11816* (2013.01); *H01L 2027/11822* (2013.01); *H01L 2027/11848* (2013.01); *H01L 2027/11866* (2013.01); *H01L 2027/11872* (2013.01); *H01L 2027/11874* (2013.01); *H01L 2027/11875* (2013.01)

(58) Field of Classification Search
CPC .......... H01L 27/0207; H01L 27/11807; H01L 2027/11812; H01L 2027/11814; H01L 2027/11816; H01L 2027/11848; H01L 2027/11866; H01L 2027/11874; H01L 2027/11875
USPC ......................................................... 257/204
See application file for complete search history.

(56) References Cited

U.S. PATENT DOCUMENTS 11,037,957 B2 *  6/2021  Chou ................ H01L 27/11807

* cited by examiner

*Primary Examiner* — Monica D Harrison
(74) *Attorney, Agent, or Firm* — WPAT Law; Anthony King (57) ABSTRACT A semiconductor structure is disclosed. The semiconductor structure includes: a first standard cell; and a second standard cell; wherein a cell width of the first standard cell along a first direction is substantially the same as a cell width of the second standard cell along the first direction, and a cell height of the first standard cell along a second direction perpendicular to the first direction is substantially greater than a cell height of the second standard cell along the second direction.

20 Claims, 9 Drawing Sheets

SEMICONDUCTOR STRUCTURE

CROSS REFERENCE TO RELATED APPLICATIONS

This application is a continuation of U.S. application Ser. No. 16/884,898, filed on May 27, 2020, which is a continuation of U.S. application Ser. No. 16/007,973, filed on Jun. 13, 2018, which claims the benefit of U.S. provisional application 62/592,178, filed on Nov. 29, 2017, which is incorporated by reference in its entirety.

BACKGROUND

Typically, in the design of integrated circuits, standard cells having fixed functions are used. Pre-designed standard cells are stored in cell libraries. When designing integrated circuits, the standard cells are retrieved from the cell libraries and placed into desired locations on an integrated circuit layout. Routing is then performed to connect the standard cells with each other.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the term "about" generally means within 10%, 5%, 1%, or 0.5% of a given value or range. Alternatively, the term "about" means within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the term "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

Figure 1:
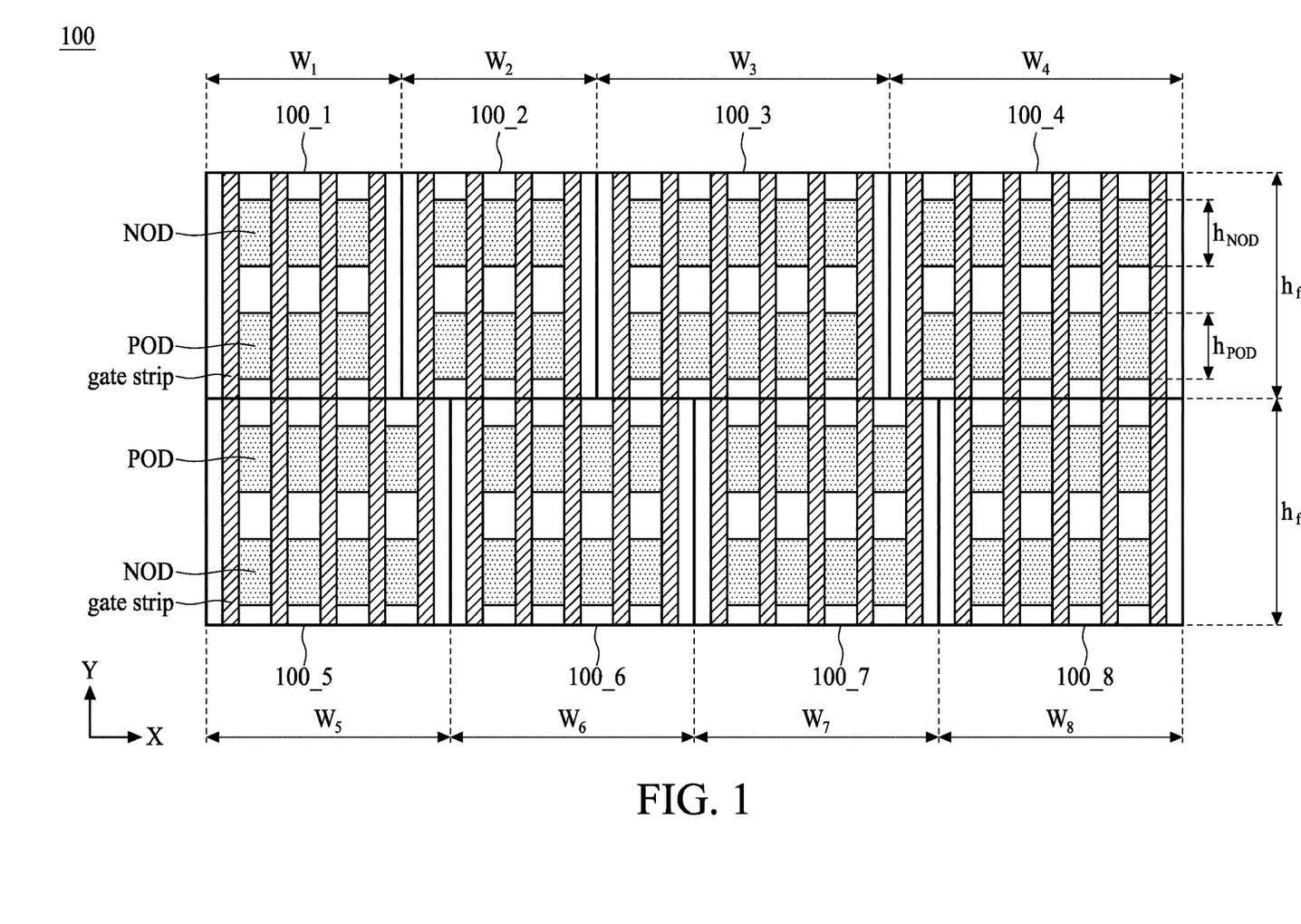
FIG. 1 is a layout view of an integrated circuit layout.

Typically, in the design of integrated circuits, standard cells having fixed functions are used. Pre-designed standard cells are stored in cell libraries. When designing integrated circuits, the standard cells are retrieved from the cell libraries and placed into desired locations on an integrated circuit layout. Routing is then performed to connect the standard cells with each other. Typically, to facilitate the placement and routing process, cells of a standard cell library have the same height. FIG. 1 is a layout view of an integrated circuit layout 100. The integrated circuit layout 100 may be comprised of a plurality of standard cells 100_1 to 100_8. The standard cells 100_1 to 100_8 may be semiconductor devices, for example, metal-oxide-semiconductor field-effect transistors or "MOSFET". The MOSFET includes planar and/or non-planar NMOS or PMOS FET devices. The non-planar device is also referred to as a vertical channel device, e.g., a FinFET or tri-gate FET device. In addition, each of the standard cells 100_1 to 100_8 may include a p-type active region and an n-type active region in conformance with the pre-layout netlist. The p-type active region may be referred to as a p-type oxide-diffusion or "POD region". The n-type active region may be referred to as an n-type oxide-diffusion or "NOD region". The POD and NOD regions may horizontally extend from left to right in each of the standard cells 100_1 to 100_8 along an X direction as depicted in FIG. 1. The POD and NOD regions shown in two dimensions may correspond to fin structures when the standard cells 100_1 to 100_8 are comprised of FinFET devices. The POD and NOD regions are separated by either a portion of a substrate or an isolation structure.

Furthermore, each of the standard cells 100_1 to 100_8 may include at least a gate strip in conformance with the pre-layout netlist. The gate strip may vertically extend from bottom to top in each of the standard cells 100_1 to 100_8 along a Y direction as depicted in FIG. 1. The gate strip may be formed of polysilicon, for example. The gate strip may be formed using processing operations of oxide deposition, polysilicon deposition, etching and sidewall formation before or after active source and drain diffusion implantation, thermal annealing, or other suitable process. The gate strip may have source and drain regions disposed on either side thereof. The gate strip may form a MOSFET gate and lie over a gate dielectric. Metal portions may be coupled to the gate strip to connect circuit elements.

In particular, each of the standard cells 100_1 to 100_8 includes a POD region and a NOD region. A predetermined height of the POD region may be referred to as $h_{POD}$. A predetermined height of the NOD region may be referred to as $h_{NOD}$. The predetermined heights $h_{POD}$ of the POD regions of the standard cells 100_1 to 100_8 are substantially equal to each other. The predetermined heights $h_{NOD}$ of the NOD regions of the standard cells 100_1 to 100_8 are substantially equal to each other. In some embodiments, the predetermined height $h_{POD}$ of the POD region may be substantially equal to the predetermined height $h_{NOD}$ of the NOD region, Each of the standard cells 100_1 to 100_8 has a predetermined cell height referred to as $h_f$. In other words, the predetermined cell heights of the standard cells 100_1 to 100_8 are configured to be substantially equal to each other.

Predetermined cell widths of the standard cells 100_1 to 100_8 are referred to as $w_1$ to $w_8$. The predetermined cell widths $w_1$ to $w_8$ may be different from each other. In particular, the numbers of gate strips of the standard cells 100_1 to 100_8 may be different from each other. In an embodiment shown in FIG. 1, each of the standard cells 100_1 and 100_2 includes 4 gate strips; each of the standard cells 100_3 and 100_4 includes 6 gate strips; and each of the standard cells 100_5 to 100_8 includes 5 gate strips. As such, the predetermined cell widths $w_1$ and $w_2$ are substantially equal to each other; the predetermined cell widths $w_3$ and $w_4$ are substantially equal to each other; and the predetermined cell widths $w_5$ to $w_8$ are substantially equal to each other.

The standard cells 100_1 to 100_8 shown in the layout view of the integrated circuit layout 100 have different cell widths and the same cell height. In some embodiments, each gate strip within the standard cells 100_1 to 100_8 may represent a transistor. However, this is not a limitation of the present disclosure. Connecting two transistors in parallel can help to substantially double the drivability compared to a single transistor. For example, the standard cells 100_1 to 100_8 correspond to the same function, but drivability of the standard cells 100_1 to 100_8 can be different from each other through connecting transistors in parallel. The drivability of the standard cells 100_3 and 100_4 zis greater than the drivability of the standard cells 100_5 to 100_8 because the gate strip number (i.e. 6 gate strips) of each of the standard cells 100_3 and 100_4 is greater than the gate strip number (i.e. 5 gate strips) of each of the standard cells 100_5 to 100_8. The drivability of the standard cells 100_5 to 100_8 is greater than the drivability of the standard cells 100_1 and 100_2 because the gate strip number (i.e. 5 gate strips) of each of the standard cells 100_5 to 100_8 is greater than the gate strip number (i.e. 4 gate strips) of each of the standard cells 100_1 and 100_2. In other words, the manner to increase cell drivability of the layout view of the integrated circuit layout 100 is to increase the transistor number through adding the gate strip number.

Figure 5:
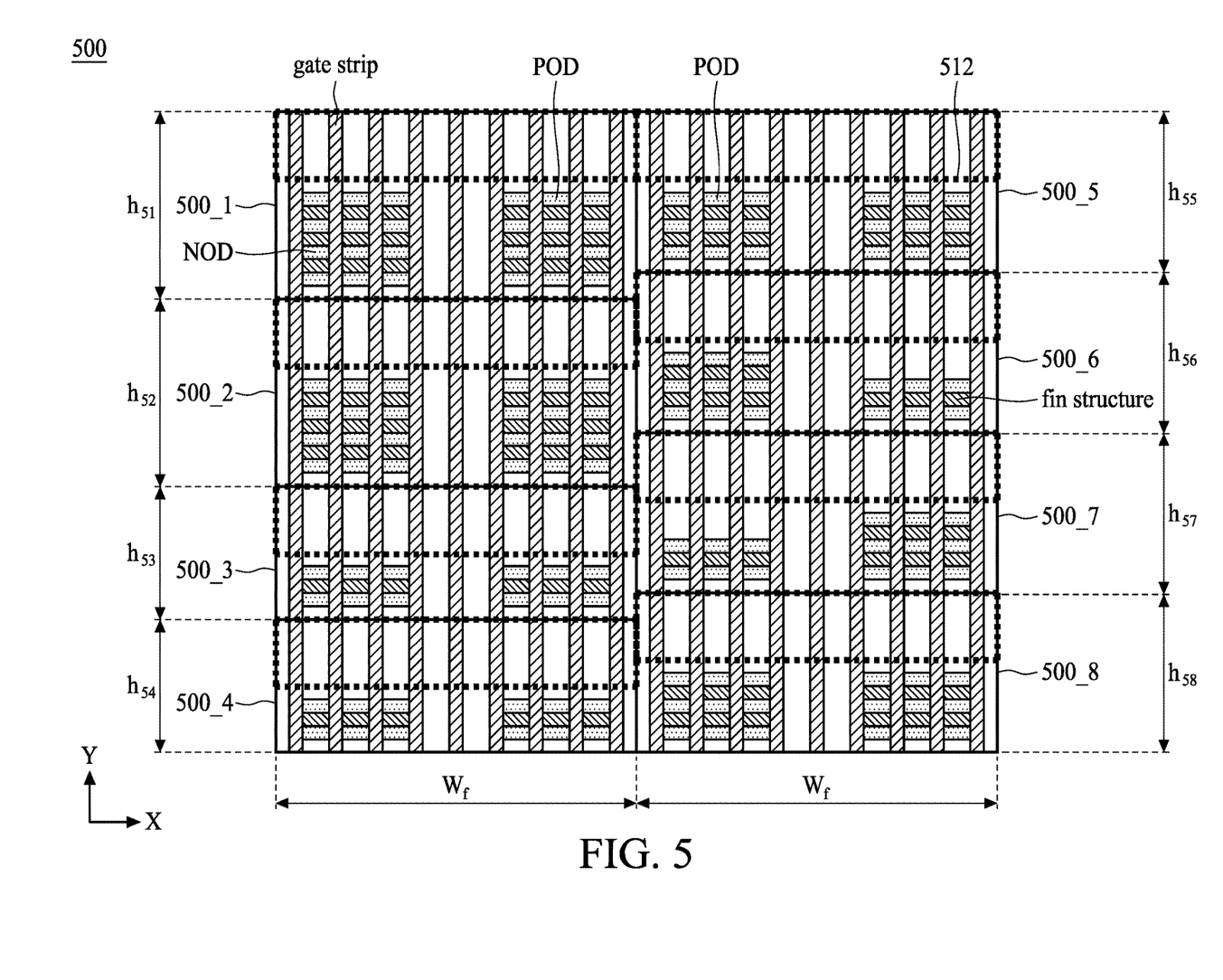
FIG. 5 is a layout view of an integrated circuit layout according to an embodiment of the present disclosure.

The present disclosure further provides embodiments illustrated in FIG. 5 to FIG. 6 and are described in detail below. The embodiments in FIG. 5 to FIG. 6 include standard cells configured to have the same gate strip number therein respectively. Through such a configuration, each of the standard cells can have a unified predetermined cell width. In particular, the manner to increase the drivability of the standard cells 100_1 to 100_8 of FIG. 1 is to increase the number of the gate strips thereof. However, with respect to the standard cells of FIG. 5 to FIG. 6, the drivability can be adjusted by increasing the area of active regions without increasing the number of the gate strips thereof. Since the number of the gate strips are not increased, the overall routing complexity of the standard cells of FIG. 5 to FIG. 6 can be kept substantially the same when the drivability is increased.

Figure 2:
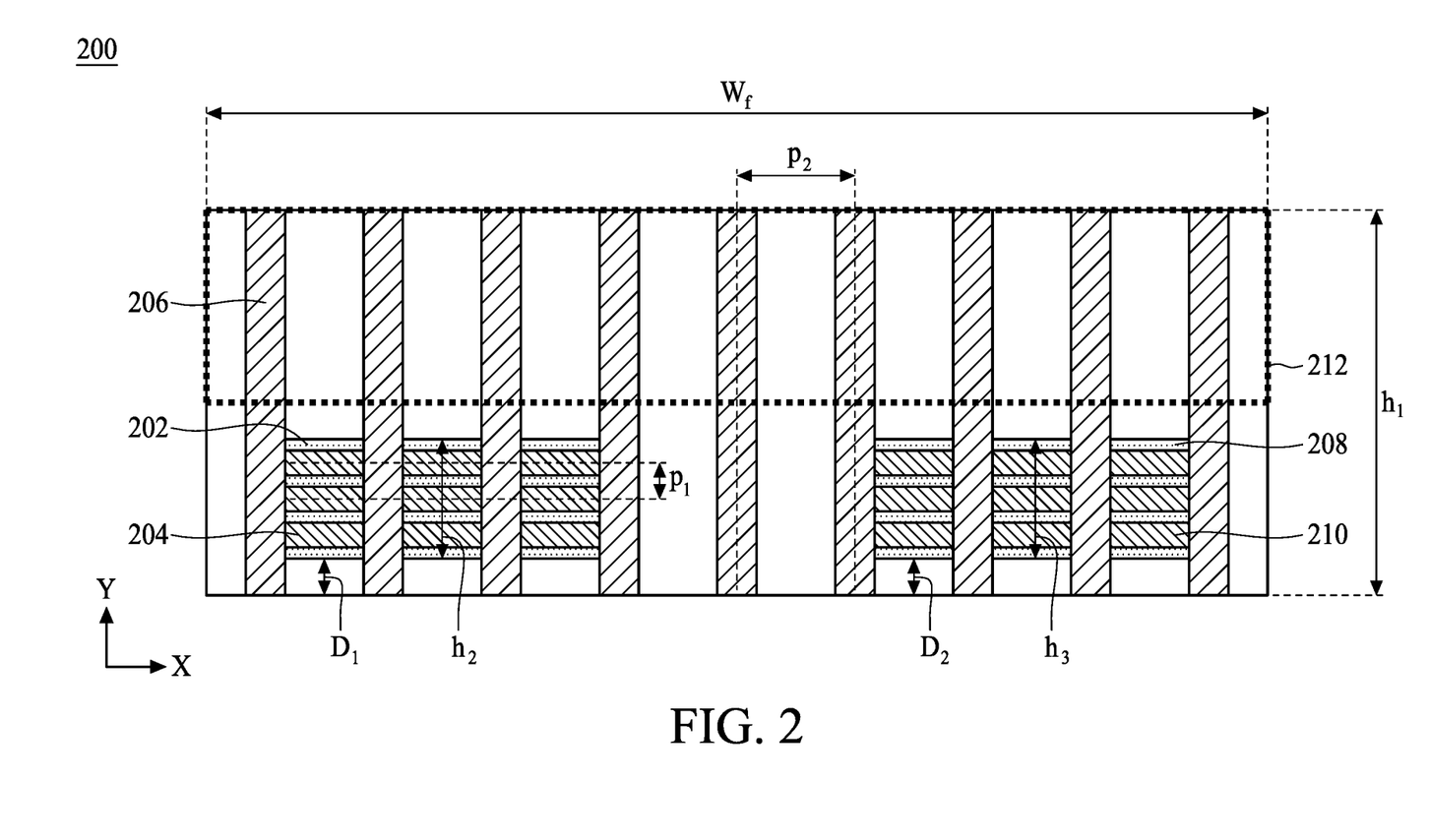
FIG. 2 is a layout view of a standard cell according to an embodiment of the present disclosure.

FIG. 2 is a layout view of a standard cell 200 according to an embodiment of the present disclosure. The standard cell 200 may include FinFET devices. In particular, the standard cell 200 includes an n-type active region 202 and a p-type active region 208 in conformance with the pre-layout netlist. As mentioned above, the n-type active region 202 may be referred to as an n-type oxide-diffusion or "NOD region". The p-type active region 208 may be referred to as a p-type oxide-diffusion or "POD region". The difference between the standard cell 200 and the standard cells 100_1 to 100_8 of FIG. 1 is that the n-type active region 202 and the p-type active region 208 are side by side (horizontally) arranged within the standard cell 200 along the X direction, and the n-type active region and the p-type active region of the standard cells 100_1 to 100_8 are vertically arranged within each standard cell along the Y direction. As a non-limiting example, the n-type active region 202 is arranged at a left portion of the standard cell 200, and the p-type active region 208 is arranged at a right portion of the standard cell 200. By contrast, the n-type active region is arranged at a top portion of the standard cell 100_1, and the p-type active region is arranged at a bottom portion of the standard cell 100_1.

In some embodiments, the n-type active region 202 may be disposed at a left side of the standard cell 200, and the the p-type active region 208 may be disposed at a right side of the standard cell 200. In some embodiments, the standard cell 200 is partitioned into two equal portions including a left half portion and a right half portion. In that case, the n-type active region 202 may be disposed at a left half portion of the standard cell 200, and the the p-type active region 208 may be disposed at a right half portion of the standard cell 200. However, this is not a limitation of the present disclosure. In many instances, the n-type active region 202 may be disposed at the right side of the standard cell 200, and the the p-type active region 208 may be disposed at the left side of the standard cell 200. In many instances, the n-type active region 202 may be disposed at the right half portion of the standard cell 200, and the the p-type active region 208 may be disposed at the left half portion of the standard cell 200.

The n-type active region 202 and the p-type active region 208 are separated by either a portion of a substrate or an isolation structure.

As shown in FIG. 2, the standard cell 200 is configured to have a rectangular shaped boundary with a cell height $h_1$ and a cell width $w_f$. In addition, a height $h_2$ of the n-type active region 202 equals to a height $h_3$ of the p-type active region 208. A distance $D_1$ between a lower boundary of the n-type active region 202 and a lower boundary of the standard cell 200 is substantially the same as a distance $D_2$ between a lower boundary of the p-type active region 208 and the lower boundary of the standard cell 200. The n-type active region 202 and the p-type active region 208 may have substantially the same width along the X direction. The n-type active region 202 and the p-type active region 208 may include a plurality of fin structures 204 and 210 respectively formed thereon when the standard cell 200 is comprised of FinFET devices. The fin structures 204 and 210 may be substantially parallel to each other and may have substantially the same size and shape. In some embodiments, the fin structures 204 and 210 may include active fin structures, dummy fin structures or a combination thereof. However, this is not a limitation of the present disclosure. In some embodiments, the dummy fin structures may be substantially larger or smaller than the active fin structures and may be of various shapes. For example, the n-type active region 202 and the p-type active region 208 have three fin structures 204 and 210 respectively along the X direction. A distance between a midline of a fin structure and a midline of another fin structure adjacent the fin structure, or referred to a fin pitch, may be a predetermined fixed value for all the fin structures 204 and 210 of the n-type active region 202 and the p-type active region 208. In the exemplary embodiment, all of the adjacent fin structures of the n-type active region 202 and the p-type active region 208 have a same fin pitch $p_1$.

Furthermore, the standard cell 200 may include gate strips 206 in conformance with the pre-layout netlist. The gate strips 206 may vertically extend from bottom to top of the standard cell 200 along the V direction as depicted in FIG. 2. In some embodiments, each of the gate strips 206 from the bottom to the top of the semiconductor standard cell structure along the second direction passes over one type of the n-type active region 202 or the p-type active region 208 from a top view. As a non-limiting example, some of the gate strips 206 can pass over the n-type active region 202 and some of the gate strips 206 can pass over the p-type active region 208. However, none of a single one of the gate strips 206 can pass over the n-type active region 202 and the p-type active region 208 at the same time. The gate strips 206 may be formed of polysilicon, for example. The gate strips 206 may be formed using processing operations of oxide deposition, polysilicon deposition, etching and sidewall formation before or after active source and drain diffusion implantation, thermal annealing, or other suitable process. The gate strips 206 may have source and drain regions disposed on either side thereof. The gate strips 206 may form a MOSFET gate and lie over a gate dielectric. Metal portions may be coupled to the gate strips 206 to connect circuit elements. A distance between a midline of a gate strip and a midline of another gate strip adjacent the gate strip, or referred to a gate pitch, may be a predetermined fixed value for all the gate strips 206. In the exemplary embodiment, all of the adjacent gate strips have a same gate pitch $p_2$. In some embodiments, the gate pitch $p_2$ is greater than the fin pitch $p_1$.

A region 212 indicated by a box with dashed border is disposed at an upper portion of the standard cell 200. However, this is not a limitation of the present disclosure. In some embodiments, the region 212 may be disposed at a lower portion or other portion of the standard cell 200. The region 212 may be reserved for further metal routing in order to interconnect the MOSFETs of the standard cell 200. The manner to adjust the drivability of the standard cells 100_1 to 100_8 of FIG. 1 is to increase or decrease the number of the gate strips thereof. However, with respect to the standard cell 200 of FIG. 2, the drivability can be adjusted by increasing or decreasing the area of the n-type active region 202 or the p-type active region 208. When the standard cell 200 is comprised of FinFET devices, the number of fin structures may be increased or decreased along with the increasing or decreasing of the area of the n-type active region 202 or the p-type active region 208 in order to adjust the drivability of the standard cell 200. As such, the height $h_2$ of the n-type active region 202 or the height $h_3$ of the p-type active region 208 may be increased or decreased. In other words, the cell height $h_1$ of the standard cell 200 may be increased or decreased but the cell width $w_f$ is fixed.

Figure 3:
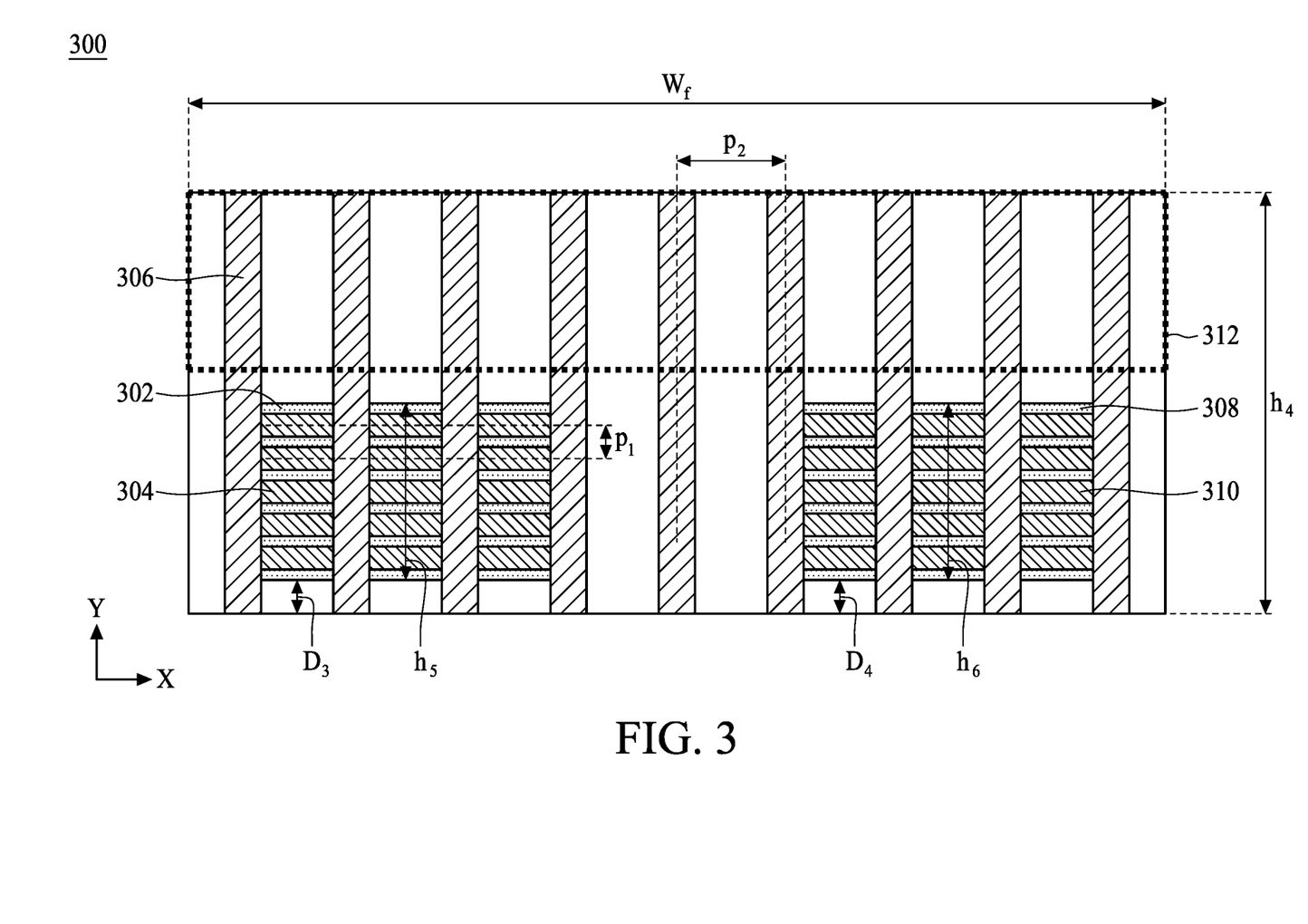
FIG. 3 is a layout view of a standard cell according to an embodiment of the present disclosure.

FIG. 3 is a layout view of a standard cell 300 according to an embodiment of the present disclosure. Similar to the standard cell 200, the standard cell 300 may include FinFET devices. In particular, the standard cell 300 includes an n-type active region 302 and a p-type active region 308 in conformance with the pre-layout netlist. As mentioned above, the n-type active region 302 may be referred to as an n-type oxide-diffusion or "NOD region". The p-type active region may be referred to as a p-type oxide-diffusion or "POD region". The difference between the standard cell 300 of FIG. 3 and the standard cell 200 of FIG. 2 is that the n-type active region 302 and the p-type active region 308 are larger than the n-type active region 202 and the p-type active region 208.

In some embodiments, the standard cell 300 is configured to have a rectangular shaped boundary with a cell height $h_4$ and a cell width $w_f$. The cell height $h_4$ is greater than the cell height $h_1$ of the standard cell 200 since the n-type active region 302 and the p-type active region 308 are larger than the n-type active region 202 and the p-type active region 208 of the standard cell 200. A height $h_5$ of the n-type active region 302 equals to a height $h_1$ of the p-type active region 308 and greater than the height $h_2$ of the n-type active region 202 and the height $h_3$ of the p-type active region 308. A distance $D_3$ between a lower boundary of the n-type active region 302 and a lower boundary of the standard cell 300 is substantially the same as a distance $D_4$ between a lower boundary of the p-type active region 308 and the lower boundary of the standard cell 300. The n-type active region 302 and the p-type active region 308 may have substantially the same width along the X direction. In particular, the n-type active region 302 and the p-type active region 308 may include a plurality of fin structures 304 and 310 respectively formed thereon when the standard cell 300 is comprised of FinFET devices.

Similar to the fin structures 204 and 210, the fin structures 304 and 310 may be substantially parallel to each other and may have substantially the same size and shape. In some embodiments, the fin structures 304 and 310 may include active fin structures, dummy fin structures or a combination thereof. However, this is not a limitation of the present disclosure. In some embodiments, the dummy fin structures may be substantially larger or smaller than the active fin structures and may be of various shapes. In some instances as shown in FIG. 3, the n-type active region 302 and the p-type active region 308 have five fin structures 304 and 310 respectively along the X direction, A fin pitch for all the fin structures 304 and 310 of the n-type active region 302 and the p-type active region 308 may be the same as the fin pitch $p_1$ of the fin structures of the n-type active region 202 and the p-type active region 208.

Furthermore, the standard cell 300 may include gate strips 306 in conformance with the pre-layout netlist. Similar to the standard cell 200, the gate strips 306 may vertically extend from bottom to top of the standard cell 300 along the Y direction as depicted in FIG. 3. In particular, each of the gate strips 306 from the bottom to the top of the semiconductor standard cell structure along the second direction can at most pass over one of the n-type active region 302 and the p-type active region 308 from a top view. The gate strips 306 may be formed of polysilicon, for example. The gate strips 306 may be formed using processing operations of oxide deposition, polysilicon deposition, etching and sidewall formation before or after active source and drain diffusion implantation, thermal annealing, or other suitable process. The gate strips 306 may have source and drain regions disposed on either side thereof. The gate strips 306 may form a MOSFET gate and lie over a gate dielectric. Metal portions may be coupled to the gate strips 206 to connect circuit elements. In the exemplary embodiment, all of the adjacent gate strips have a same gate pitch $p_2$. In some embodiments, the gate pitch $p_2$ is greater than the fin pitch $p_1$.

Since the number of the fin structures 304 and 310 of the n-type active region 302 and the p-type active region 308 is 5/3 the number of fin structures 204 and 210 of the n-type active region 202 and the p-type active region 208, the drivability of the standard cell 300 may be substantially about 5/3 of the drivability of the standard cell 200. As mentioned above, adjusting or tuning the drivability of the standard cells can be achieved through adjusting the gate strip number (like the way illustrated in FIG. 1) or adjusting the fin structure number (like the way illustrated in FIG. 2 and FIG. 3). Generally, the increased or reduced area caused by adding or removing one fin structure is less than the increased or reduced area caused by adding or removing one gate strip. Therefore, it may be more advantageous for cell area control when adjusting or tuning the drivability of the standard cells through adjusting the fin structure number compared to adjusting the gate strip number.

A region 312 indicated by a box with dashed border is disposed at an upper portion of the standard cell 300. However, this is not a limitation of the present disclosure. In some embodiments, the region 312 may be disposed at a lower portion or other portion of the standard cell 300. Similar to the standard cell 200, the region 312 may be reserved for further metal routing in order to interconnect the MOSFETs of the standard cell 300. An area size of the regions 212 and 312 depends on the complexity of the wire routing therein, and the complexity of the wire routing therein depends on the number of gate strips in the cells 200 and 300. Therefore, a size of the region 312 may be substantially the same as the size of the region 212 of the standard cell 200 since the number of gate strips in the cell 200 and the number of gate strips in the cell 300 are the same. That is to say, the drivability of the standard cell 300 is increased compared to the drivability of the standard cell 200, but the region 312 for wire routing are not enlarged compared to the region 212 of the standard cell 200.

Figure 4:
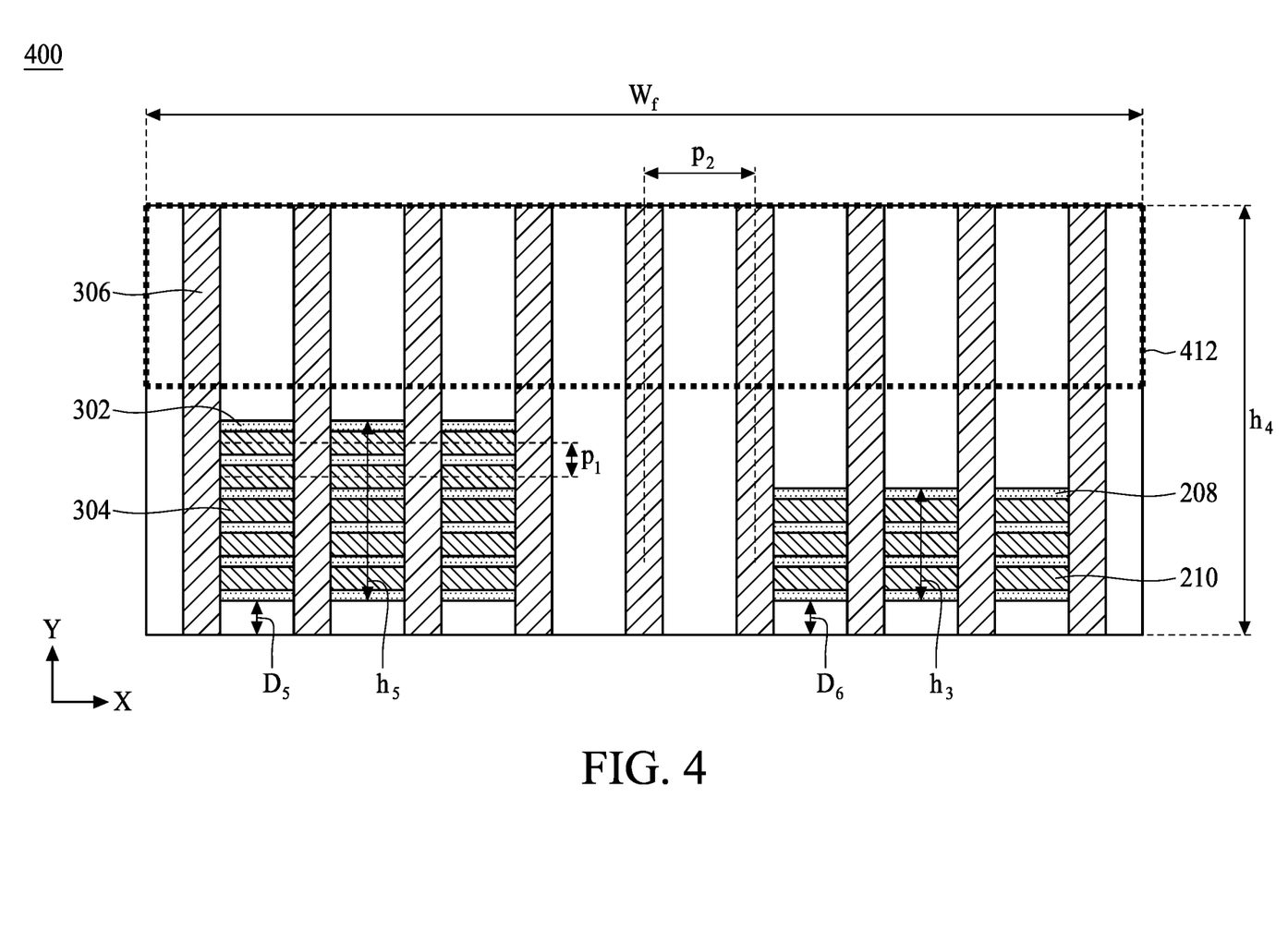
FIG. 4 is a layout view of a standard cell according to an embodiment of the present disclosure.

In some embodiments, the drivability of a portion of the MOSFETs of the standard cell 200 or 300 may be adjusted separately when only the portion of the MOSFETs requires a larger drivability. FIG. 4 is a layout view of a standard cell 400 according to an embodiment of the present disclosure, Similar to the standard cells 200 and 300, the standard cell 400 may include FinFET devices. In particular, the standard cell 400 includes an n-type active region the substantially same to the n-type active region 302 of the standard cell 300. The standard cell 400 further includes a p-type active region substantially the same as the p-type active region 308. As shown in FIG. 4, the number of the fin structures 304 and the number of the fin structures 210 can be different. In this case, the standard cell 400 may require an n-type MOSFET with larger drivability compared to a corresponding p-type MOSFET thereof. A cell height of the standard cell 400 may be substantially the same as the cell height $h_4$ of the standard cell 300. A cell width of the standard cell 400 may be substantially the same with the cell width $w_f$ of the standard cells 200 and 300. A distance $D_5$ between a lower boundary of the n-type active region 302 and a lower boundary of the standard cell 400 is substantially the same as a distance $D_6$ between a lower boundary of the p-type active region 208 and the lower boundary of the standard cell 400. The n-type active region 302 and the p-type active region 208 may have substantially the same width along the X direction.

A region 412 indicated by a box with dashed border is disposed at an upper portion of the standard cell 400. However, this is not a limitation of the present disclosure. In some embodiments, the region 412 may be disposed at a lower portion or other portion of the standard cell 400. Similar to the standard cells 200 and 300, the region 412 may be reserved for further metal routing in order to interconnect the MOSFETs of the standard cell 400. A size of the region 412 may be substantially the same as the size of the region 212 of the standard cell 200 and the region 312 of the standard cell 300 since the number of gate strips in the cell 400 and the number of gate strips in the cell 200 and 300 are the same, FIG. 5 is a layout view of an integrated circuit layout 500. The integrated circuit layout 500 may include a plurality of standard cells 500_1 to 500_8. The standard cells 500_1 to 500_8 are comprised of non-planar NMOS or PMOS FET devices, e.g., a FinFET or tri-gate FET device. In addition, each of the standard cells 500_1 to 500_8 may include an n-type active region denoted as "NOD" and a p-type active region denoted as "POD" in conformance with the pre-layout netlist. The POD and NOD regions may be arranged in a manner substantially the same as the POD and NOD arrangement of the standard cells 200, 300 and 400. The POD and NOD regions shown in two dimensions include fin structures. The POD and NOD regions are separated by either a portion of a substrate or an isolation structure.

In some embodiments, the arrangement of the POD and NOD regions depends on the arrangement of the POD and NOD regions of neighboring standard cells. For example, the standard cell 500_1 and the standard cell 500_5 neighboring the standard cell 500_1 in X direction have an opposite arrangement of the POD and NOD regions. In more detail, the POD region of the standard cell 500_1 is at the right side of the standard cell 500_1, and the POD region of the standard cell 500_5 is at the left side of the standard cell 500_5, in order to allow two active regions of the same type adjacent to each other. For example, the POD regions of the standard cells 500_2 to 500_4 are at the right side of the standard cells 500_2 to 500_4, and the POD region of the standard cells 500_6 to 500_8 are at the left side of the standard cells 500_6 to 500_8 respectively, in order to allow two active regions of the same type adjacent to each other. In other words, the standard cells 500_1, 500_2, 500_3 and 500_4 in the same column (i.e. the left column of the integrated circuit layout 500) along the Y direction have the same arrangement of the POD and NOD regions; and the standard cells 500_5, 500_6, 500_7 and 500_8 in the same column (i.e. the right column of the integrated circuit layout 500) along the Y direction have the same arrangement of the POD and NOD regions. In an analogous way, the standard cells abutting the standard cells 500_5 to 500_8 at right side of the standard cells 500_5 to 500_8 have NOD regions adjacent to the NOD regions of the standard cells 500_5 to 500_8; and the standard cells abutting the standard cells 500_1 to 500_4 at left side of the standard cells 500_1 to 500_4 have NOD regions adjacent to the NOD regions of the standard cells 500_1 to 500_4.

Furthermore, each of the standard cells 500_1 to 500_8 may include the same number of gate strips vertically extend from bottom to top in each of the standard cells 500_1 to 500_8 along the Y direction. The gate strip may be formed of polysilicon, for example. A predetermined height of the POD region and a predetermined height of the NOD region of each of the standard cells 500_1 to 500_8 are not restricted to be uniform. For example, the predetermined heights of the NOD regions of the standard cells 500_1 to 500_8 may be different from each other, and the predetermined heights of the POD regions of the standard cells 500_1 to 500_8 may be different from each other. Each of the standard cells 500_1 to 500_8 may include a region 512 indicated by a box with dashed border and disposed at an upper portion of each of the standard cells 500_1 to 500_8. However, this is not a limitation of the present disclosure. In some embodiments, the region 512 may be disposed at a lower portion or other portion of each of the standard cells 500_1 to 500_8. Similar to the standard cell 200, the region 512 may be reserved for further metal routing in order to interconnect the MOSFETs of each of the standard cells 500_1 to 500_8. The regions 512 in the standard cells 500_1 to 500_8 may be substantially the same size.

The numbers of gate strips of the standard cells 500_1 to 500_8 is configured to be the same as each other. As specifically illustrated in FIG. 5, each of the standard cells 500_1 to 500_8 has 9 gate strips. Through such a configuration, each of the standard cells 500_1 to 500_8 can have a unified predetermined cell width referred to as $w_f$. In other words, the predetermined cell widths of the standard cells 500_1 to 500_8 are configured to be substantially equal to each other since the cell width $w_f$ is proportional to a number of transistors or gate strips in the standard cells 500_1 to 500_8, and the number of transistors or gate strips in each of the standard cells 500_1 to 500_8 is the same to each other.

Predetermined cell heights of the standard cells 500_1 to 500_8 are referred to as $h_{51}$ to $h_{58}$. As discussed above, the cell heights $h_{51}$ to $h_{58}$ are proportional to the number of the fin structures in each of the standard cells 500_1 to 500_8 while the standard cells 500_1 to 500_8 have the same number of gate strips (i.e. four gate strips). That is to say, the variation of cell heights $h_{51}$ to $h_{58}$ is independent of the number of gate strips in each of the standard cells 500_1 to 500_8. The predetermined cell heights $h_{51}$ to $h_{58}$ may be different from each other because the predetermined heights of the NOD regions of the standard cells 500_1 to 500_8 may be different from each other. In an embodiment shown in FIG. 5, each of the standard cells 500_1 and 500_2 has the NOD and POD regions of the same height with 3 fin structures thereof; each of the standard cells 500_3 and 500_4 has the NOD and POD regions of the same height with 1 fin structures thereof; and each of the standard cells 500_5 and 500_8 has the NOD and POD regions of the same height with 2 fin structures thereof. In particular, the standard cell 500_6 has the NOD and POD regions with different heights, and the NOD region includes 1 fin structure and the POD region includes 2 fin structures; the standard cell 500_7 has the NOD and POD regions with different heights, and the NOD region includes 2 fin structures and the POD region includes 1 fin structure.

The predetermined cell heights $h_{51}$ and $h_{52}$ are substantially equal to each other; the predetermined cell heights $h_{53}$ and $h_{54}$ are substantially equal to each other. When the heights of the NOD and POD regions of a same standard cell are different, the cell height of the standard cell may be determined based on the region having a greater height since the standard cell needs to accommodate both of the NOD and POD regions. As such, the predetermined cell heights $h_{56}$ and $h_{57}$ are substantially equal to each other and also equal to the predetermined cell heights $h_{55}$ and $11_{58}$. As mentioned above, increasing fin structures by expanding heights of the NOD and/or POD regions of the standard cells can increase the drivability of the corresponding transistors and standard cell accordingly. More importantly, it can be said that increasing fin structures by expanding heights of the NOD and/or POD regions substantially increases the size of the corresponding transistors. But increasing gate strips of the NOD and/or POD regions substantially increases the number of the transistors, Therefore, the manner of adjusting drivability of the standard cells of FIG. 5 through adjusting the fin structure number has no influences to the routing complexity.

Figure 6:
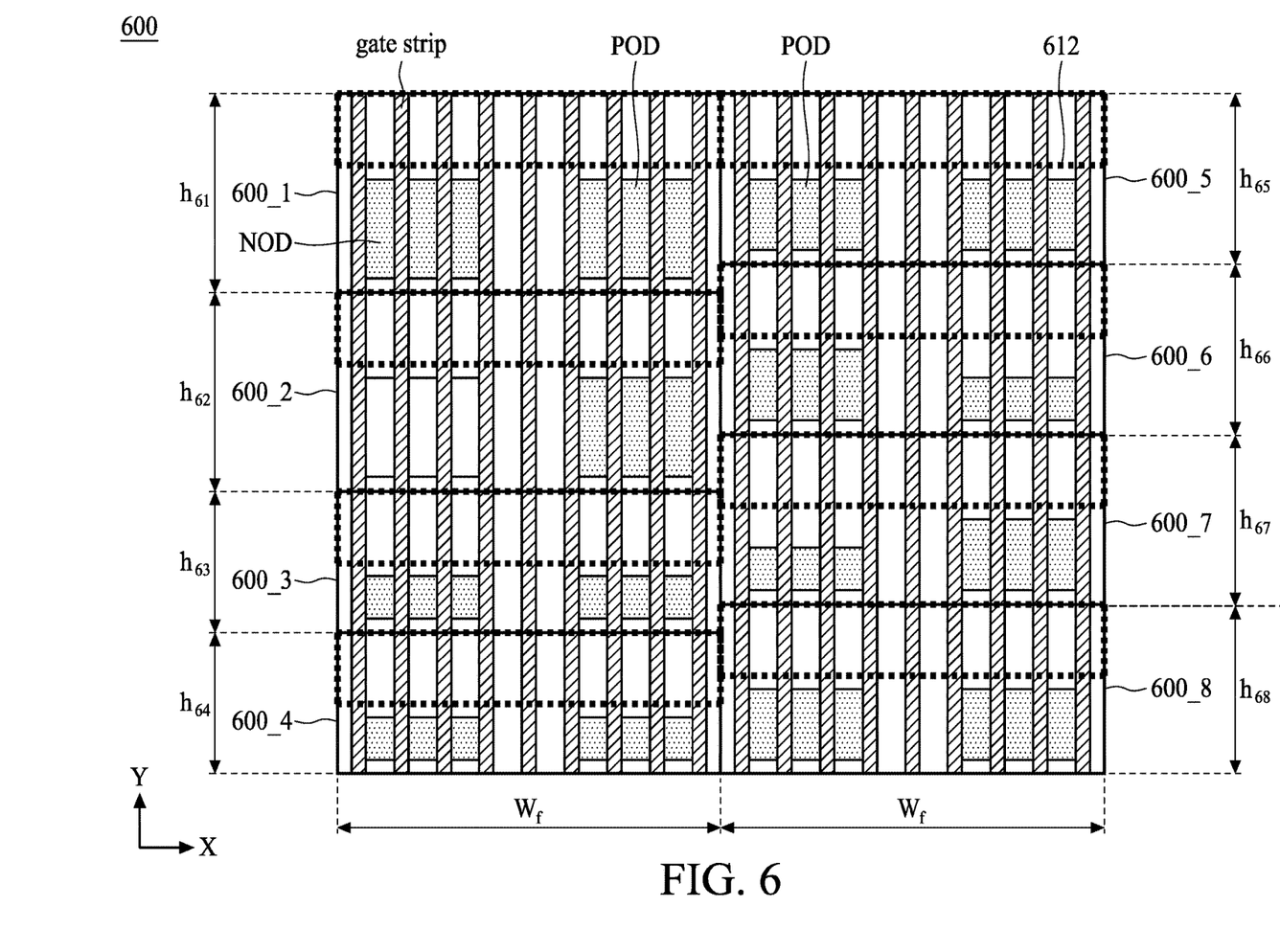
FIG. 6 is a layout view of an integrated circuit layout according to an embodiment of the present disclosure.

FIG. 6 is a layout view of an integrated circuit layout 600 according to an embodiment of the present disclosure. The integrated circuit layout 600 may include a plurality of standard cells 600_1 to 600_8. The difference between the integrated circuit layout 600 and the integrated circuit layout 500 is that the standard cells 600_1 to 600_8 are comprised of planar NMOS or PMOS FET devices.

Predetermined cell heights of the standard cells 600_1 to 600_8 are referred to as $h_{61}$ to $h_{68}$. Like the standard cells 500_1 to 500_8, the predetermined cell heights $h_{61}$ to $h_{68}$ may be different from each other because the predetermined heights of the NOD regions of the standard cells 600_1 to 600_8 may be different from each other. In an embodiment shown in FIG. 6, each of the standard cells 600_1 and 600_2 has the NOD and POD regions of the same height; each of the standard cells 600_3 and 600_4 has the NOD and POD regions of the same height; and each of the standard cells 600_5 and 600_8 has the NOD and POD regions of the same height. In particular, the standard cell 600_6 has the NOD and POD regions with different heights; and the standard cell 600_7 has the NOD and POD regions with different heights.

The predetermined cell heights $h_{61}$ and $h_6$, are substantially equal to each other; the predetermined cell heights $h_{63}$ and $h_{64}$ are substantially equal to each other. When the heights of the NOD and POD regions of a same standard cell are different, the cell height of the standard cell may be determined based on the region having a greater height since the standard cell needs to accommodate both of the NOD and POD regions. As such, the predetermined cell heights $h_{66}$ and $h_{67}$ are substantially equal to each other and also equal to the predetermined cell heights $h_{65}$ and $h_{68}$. Expanding heights of the NOD and/or POD regions of the standard cells can increase the drivability of the corresponding transistors and standard cell accordingly. More importantly, it can be said that expanding heights of the NOD and/or POD regions substantially increases the size of the corresponding transistors. But increasing gate strips of the NOD and/or POD regions substantially increases the number of the transistors. Therefore, unlike the manner of adjusting drivability of the standard cells of FIG. 1, the manner of adjusting drivability of the standard cells of FIG. 6 has no influences to the routing complexity.

Figure 7:
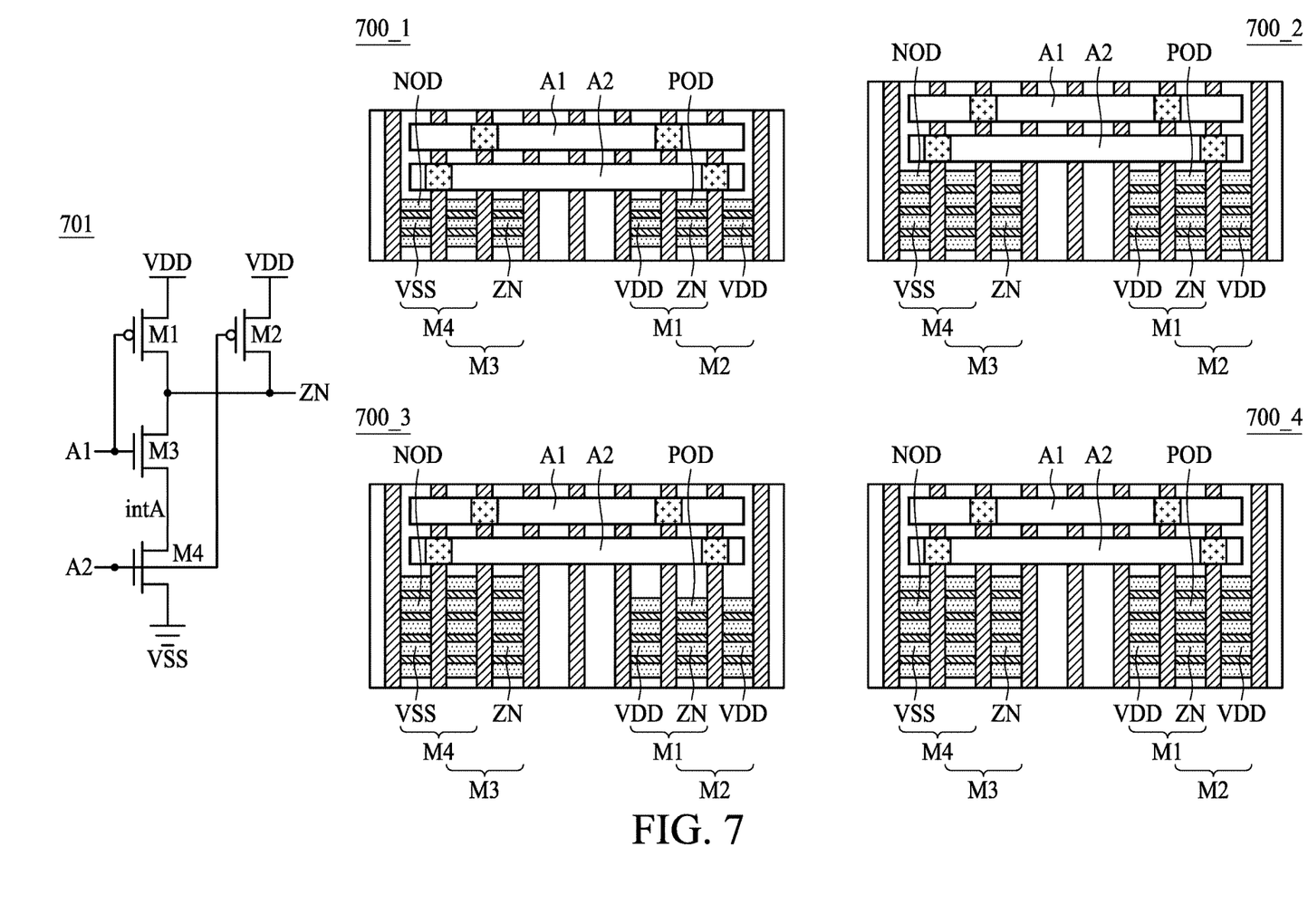
FIG. 7 is a diagram illustrating a schematic of a NAND (negative-AND) cell and corresponding layout views of integrated circuit layouts of the NAND cell according to an embodiment of the present disclosure.

FIG. 7 is a diagram illustrating a schematic of a NAND (negative-AND) cell and corresponding layout views of integrated circuit layouts of the NAND cell according to an embodiment of the present disclosure. The schematic 701 of the NAND cell includes PMOS FET devices M1 and M2 and N MOS FET devices M3 and M4. Sources of the PMOS FET devices M1 and M2 are coupled to a positive potential or voltage VDD (for example, 5.0 volts) which is connected to an internal power supply potential node. Drains of the PMOS FET devices M1 and M2 are coupled to a drain of the NMOS FET device M3, and a source of the NMOS FET device M3 is coupled to a drain of the of the NMOS BET device M4. A source of the NMOS FET device M4 is coupled to a ground potential VSS (for example, 0 volts) which is connected to an internal ground potential node. A first input node A1 is coupled to gates of the PMOS FET device M1 and the NMOS FET device M3. A second input node A2 is coupled to a gate of the PMOS FET device M2 and a gate of the NMOS FET device M4. An output node ZN is coupled to the drains of the PMOS FET devices M1 and M2 and the drain of the NMOS BET device M3.

Corresponding layout views of integrated circuit layouts of the NAND cell includes NAND cells 700_1, 700_2, 700_3, and 700_4, each including a plurality of fin structures in an NOD region and a plurality of fin structures in a POD region. Furthermore, each of the NAND cells 700_1, 700_2, 700_3, and 700_4 may include a plurality of gate strips vertically extending from bottom to top therein to form the NMOS FET devices M4 and M3 and the PMOS FET devices M1 and M2 from left side to right side as illustrated. The number of the gate strips in each of the NAND cells 700_1, 700_2, 700_3, and 700_4 is the same to each other. The number of the fin structures in the NOD region and the POD region of each of the NAND cells 700_1, 700_2, 700_3, and 700_4 may be different from each other in order to obtain the NAND cells with different drivability. In particular, drivability of the NMOS FET devices M3 and M4 of the NAND cells 700_3 and the NMOS FET devices M3 and M4 and the PMOS FET devices M1 and M2 of the NAND cells 700_4 is greater than the PMOS FET devices M1 and M2 of the NAND cells 700_3 and the NMOS FET devices M3 and M4 and the PMOS FET devices M1 and M2 of the NAND cells 700_2. The drivability of the PMOS FET devices M1 and M2 of the NAND cells 700_3 and the NMOS FET devices M3 and M4 and the PMOS FET devices Mt and M2 of the NAND cells 700_2 is greater the NMOS FET devices M3 and M4 and the PMOS YET devices M1 and M2 of the NAND cells 700_1.

Figure 8:
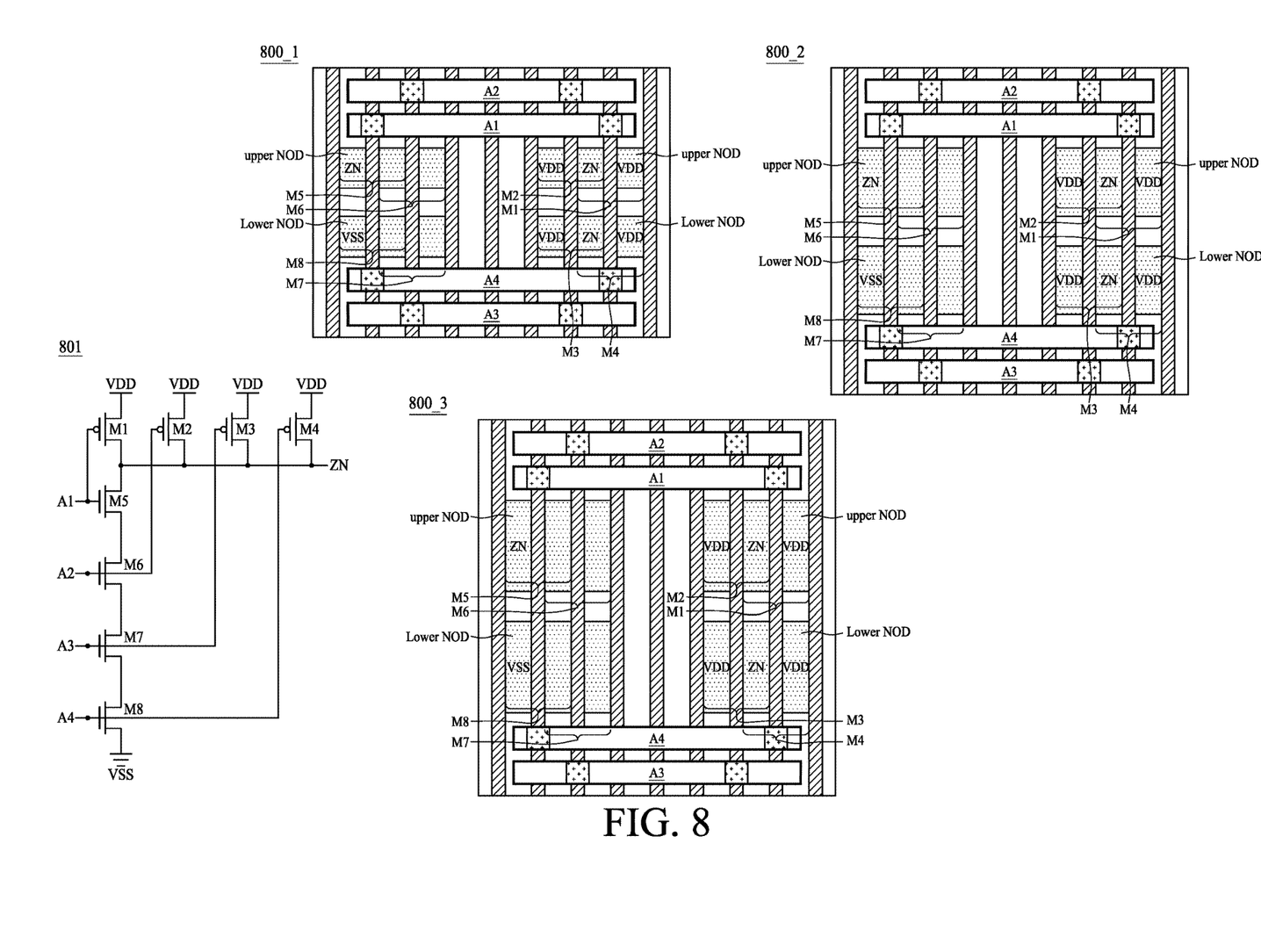
FIG. 8 is a diagram illustrating a schematic of a 4-way NAND cell and corresponding layout views of integrated circuit layouts of 4-way NAND cell according to an embodiment of the present disclosure.

FIG. 8 is a diagram illustrating a schematic of a 4-way NAND cell and corresponding layout views of integrated circuit layouts of 4-way NAND cell according to an embodiment of the present disclosure. The schematic 801 of the 4-way NAND cell includes PMOS FET devices M1 to M4 and NMOS FET devices M5 and M8.

Sources of the PMOS FET devices M1 to M4 are coupled to a positive potential or voltage VDD (for example, 5.0 volts) which is connected to an internal power supply potential node. Drains of the PMOS FET devices M1 to M4 are coupled to a drain of the NMOS FET device M5. A source of the NMOS FET device M5 is coupled to a drain of the NMOS FET device M6. A source of the NMOS FET device M6 is coupled to a drain of the NMOS FET device M7. A source of the NMOS FET device M7 is coupled to a drain of the NMOS FET device M8. A source of the NMOS FET device M8 is coupled to a ground potential VSS (for example, 0 volts) which is connected to an internal ground potential node. A first input node A1 is coupled to gates of the PMOS FET device M1 and the NMOS FET device M5. A second input node A2 is coupled to gates of the PMOS FET device M2 and the NMOS FET device M6. A third input node A3 is coupled to gates of the PMOS FET device M3 and the NMOS FET device M7. A fourth input node A4 is coupled to gates of the PMOS FET device M4 and the NMOS FET device M8. An output node ZN is coupled to the drains of the PMOS FET devices M1 to M4 and the drain of the NMOS FET device M5.

Corresponding layout views of integrated circuit layouts of the NAND cell includes 4-way NAND cells 800_1, 800_2, and 800_3, each including a plurality of fin structures (not shown) in upper and lower NOD regions and a plurality of fin structures (not shown) in upper and lower POD regions. Furthermore, each of the 4-way NAND cells 800_1, 800_2, and 800_3 may include a plurality of gate strips vertically extending from bottom to top therein to form the NMOS FET devices M5 and M6 and the PMOS FET devices M2 and M1 from left side to right side at the upper NOD and POD respectively, and the NMOS FET devices M8 and M7 and the PMOS FET devices M3 and M4 from left side to right side at the lower NOD and POD respectively as illustrated. The number of the gate strips in each of the 4-way NAND cells 800_1, 800_2 and 800_3 is the same to each other. The number of the fin structures in the NOD region and the POD region of each of the 4-way NAND cells 800_1, 800_2, and 800_3 may be different from each other in order to obtain the 4-way NAND cells with different drivability. In particular, drivability of the PMOS FET devices M1 to M4 and the NMOS FET devices M5 to M8 of the NAND cells 800_3 is greater than the PMOS FET devices M1 to M4 and the NMOS FET devices M5 to M8 of the NAND cells 800_2, The drivability of the PMOS FET devices M1 to M4 and the NMOS FET devices M5 to M8 of the NAND cells 800_2 is greater than the PMOS FET devices M1 to M4 and the NMOS FET devices M5 to M8 of the NAND cells 800_1.

Figure 9:
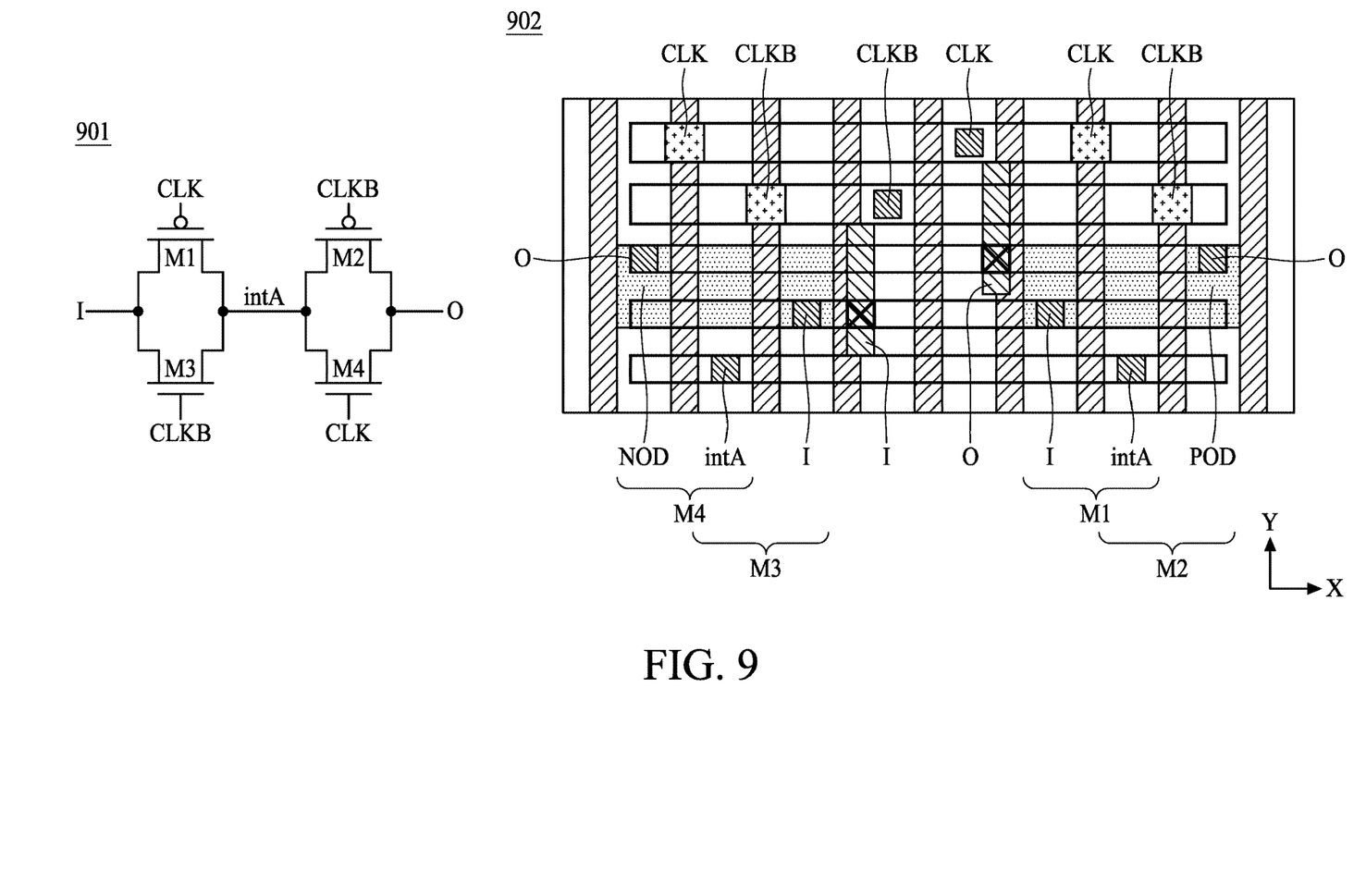
FIG. 9 is a diagram illustrating a schematic of a transmission gate and corresponding layout views of integrated circuit layouts of the transmission gate according to an embodiment of the present disclosure.

FIG. 9 is a diagram illustrating a schematic of a transmission gate and corresponding layout views of integrated circuit layouts of the transmission gate according to an embodiment of the present disclosure. The schematic 901 of the transmission gate includes PMOS FET devices M1 and M2 and NMOS FET devices M3 and M4. An input node I is coupled to a source of the PMOS FET device M1 and a drain of the NMOS FET device M3. An intermediate node intA is coupled to a drain of the PMOS FET device M1, a source of the NMOS FET device M3, a source of the PMOS FET device M2, and a drain of the NMOS FET device M4. An output node O is coupled to a drain of the PMOS FET device M2 and a source of the NMOS FET device M4.

Corresponding layout views of integrated circuit layouts of the transmission gate includes a transmission gate cell 902, including a plurality of fin structures (not shown) in an NOD region and a plurality of fin structures (not shown) in a POD region, wherein the NOD region and the POD region are side by side arranged along an X direction. The transmission gate cell 902 may include a plurality of gate strips vertically extending from bottom to top therein to form the NMOS FET devices M4 and M3 and the PMOS FET devices M1 and M2 from left side to right side as illustrated. As discussed throughout the disclosure, drivability of the NMOS FET devices M4 and M3 and the PMOS YET devices M1 and M2 may be adjusted by extending or reducing a height in a Y direction of the NOD region and/or the POD region instead of adjusting the number of the gate strips.

Some embodiments of the present disclosure provide a semiconductor structure. The semiconductor structure includes: a first standard cell including a plurality of gate strips arranged therein; and a second standard cell including a plurality of gate strips arranged therein; wherein a cell width of the first standard cell along a first direction is substantially the same as a cell width of the second standard cell along the first direction; and wherein the cell width of the first standard cell is determined according to a number of the gate strips arranged in the first standard cell, and the cell width of the second standard cell is determined according to a number of the gate strips arranged in the second standard cell; and a drivability of the first or second standard cells depends on the corresponding cell height of the first or second standard cells along a second direction perpendicular to the first direction.

Some embodiments of the present disclosure provide a semiconductor standard cell structure. The semiconductor standard cell structure includes: an n-type active region and a p-type active region side by side disposed along a first direction; and a plurality of gate strips extending from a bottom to a top of the semiconductor standard cell structure along a second direction perpendicular to the first direction; wherein each of the gate strips passes over one type of the n-type active region or the p-type active region from a top view.

Some embodiments of the present disclosure provide a semiconductor structure. The semiconductor structure includes: a first standard cell including: an re-type active region and a p-type active region side by side disposed along a first direction; and a plurality of gate strips extending from a bottom to a top of the first standard cell along a second direction perpendicular to the first direction, wherein each of the gate strips passes over one type of the n-type active region or the p-type active region of the first standard cell from a top view; and a second standard cell including: an n-type active region and a p-type active region side by side disposed along the first direction; and a plurality of gate strips extending from a bottom to a top of the second standard cell along the second direction, wherein each of the gate strips passes over one of the n-type active region or the p-type active region of the second standard cell from the top view; wherein a number of the gate strips in the first standard cell is substantially the same as a number of the gate strips in the second standard cell.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
   first standard cell having a cell width along a first direction and a cell height along a second direction, the first standard cell including a plurality of gate strips arranged therein; and
   a second standard cell having a cell width along the first direction and a cell height along the second direction, the second standard cell including a plurality of gate strips arranged therein;
   wherein the cell height of the first standard cell is substantially different from the cell height of the second standard cell; and
   wherein the cell width of the first standard cell is determined according to a number of the gate strips arranged in the first standard cell, and the cell width of the second standard cell is determined according to a number of the gate strips arranged in the second standard cell.

2. The semiconductor structure of claim 1, wherein the first standard cell comprises a first n-type active region and a first p-type active region disposed along the first direction, and the second standard cell comprises a second n-type active region and a second p-type active region disposed along the first direction.

3. The semiconductor structure of claim 2, wherein the first standard cell further comprises a plurality of first gate strips passing through the first standard cell along the second direction, and the second standard cell further comprises a plurality of second gate strips passing through the second standard cell along the second direction.

4. The semiconductor structure of claim 3, wherein a number of the first gate strips is substantially the same as a number of the second gate strips.

5. The semiconductor structure of claim 2, wherein a width of the first n-type active region along the first direction is substantially the same as a width of the second n-type active region along the first direction, and a width of the first p-type active region along the first direction is substantially the same as a width of the second p-type active region along the first direction.

6. The semiconductor structure of claim 2, wherein a height of the first n-type active region along the second direction is greater than a height of the second n-type active region along the second direction.

7. The semiconductor structure of claim 2, wherein a height of the first p-type active region along the second direction is greater than a height of the second p-type active region along the second direction.

8. The semiconductor structure of claim 6, wherein each of the first n-type active region and the second n-type active region comprises a plurality of fin structure, and a number of the fin structures of the first n-type active region is greater than a number of the fin structures of the second n-type active region.

9. The semiconductor structure of claim 7, wherein each of the first p-type active region and the second p-type active region comprises a plurality of fin structure, and a number of the fin structures of the first p-type active region is greater than a number of the fin structures of the second p-type active region.

10. A semiconductor standard cell structure, comprising:
    an n-type active region and a p-type active region side by side disposed along a first direction; and
    a plurality of gate strips extending from a bottom to a top of the semiconductor standard cell structure along a second direction perpendicular to the first direction;
    wherein the n-type active region includes a plurality of first fin structures thereon along the first direction, and the p-type active region comprises a plurality of second fin structures thereon along the first direction, and a number of the first fin structures is different from a number of the second fin structures.

11. The semiconductor standard cell structure of claim 10, wherein a height of the s-type active region along the second direction is substantially different from a height of the p-type active region along the second direction.

12. The semiconductor standard cell structure of claim 10, wherein a width of the n-type active region along the first direction is substantially the same as a width of the p-type active region along the first direction.

13. The semiconductor standard cell structure of claim 10, wherein a distance between a lower boundary of the n-type active region and a lower boundary of the semiconductor standard cell structure is substantially the same as a distance between a lower boundary of the p-type active region and the lower boundary of the semiconductor standard cell structure.

14. The semiconductor standard cell structure of claim 10, further comprising a reserved region for metal routing, and the reserved region is free from overlapping the n-type active region and the p-type active region.

15. The semiconductor standard cell structure of claim 14, wherein a height of the reserved region depends on a number of gate strips of the semiconductor standard cell structure.

16. The semiconductor standard cell structure of claim 10, wherein the semiconductor standard cell structure includes a negative-AND or a transmission gate.

17. The semiconductor standard cell structure of claim 10, wherein within the semiconductor standard cell structure, each of the gate strips passes over only one of the n-type active region or the p-type active region from a top view.

18. A semiconductor structure, comprising:
a first standard cell including:
an n-type active region and a p-type active region side by side disposed along a first direction;
a plurality of gate strips extending from a bottom to a top of the first standard cell along a second direction perpendicular to the first direction; and
a reserved region for metal routing; and
a second standard cell including:
an n-type active region and a p-type active region side by side disposed along the first direction;
a plurality of gate strips extending from a bottom to a top of the second standard cell along the second direction; and
a reserved region for metal routing, and a height of the reserved region of the first standard cell is the same as a height of the reserved region of the second standard cell;
wherein a height of the n-type active region of the first standard cell is different from a height of the n-type active region of the second standard cell.

19. The semiconductor structure of claim 18, wherein within the second standard cell, each of the gate strips passes over only one of the n-type active region or the p-type active region of the second standard cell from the top view.

20. The semiconductor structure of claim 18, wherein a number of the gate strips in the first standard cell is substantially the same as a number of the gate strips in the second standard cell.

* * * * *